US012621928B2

(12) United States Patent
Oyoshi et al.

(10) Patent No.: US 12,621,928 B2
(45) Date of Patent: May 5, 2026

(54) WIRING BOARD

(71) Applicant: KYOCERA Corporation, Kyoto (JP)

(72) Inventors: Takafumi Oyoshi, Osaka (JP); Suguru Kadowaki, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 214 days.

(21) Appl. No.: 18/711,693

(22) PCT Filed: Nov. 29, 2022

(86) PCT No.: PCT/JP2022/044033
§ 371 (c)(1),
(2) Date: May 20, 2024

(87) PCT Pub. No.: WO2023/100894
PCT Pub. Date: Jun. 8, 2023

(65) Prior Publication Data
US 2025/0016912 A1     Jan. 9, 2025

(30) Foreign Application Priority Data

Nov. 30, 2021     (JP) ................................. 2021-193961

(51) Int. Cl.
H05K 1/00          (2006.01)
H05K 1/02          (2006.01)
H05K 1/181         (2026.01)

(52) U.S. Cl.
CPC ......... H05K 1/0271 (2013.01); H05K 1/0298 (2013.01); H05K 1/181 (2013.01);
(Continued)

(58) Field of Classification Search
CPC .... H05K 1/0271; H05K 1/0298; H05K 1/181; H05K 2201/068; H05K 2201/09072;
(Continued)

(56) References Cited

U.S. PATENT DOCUMENTS 6,259,154 B1      7/2001   Niwa
7,173,342 B2 *    2/2007   Tay ................... H01L 23/49816
                                                      257/E23.07
(Continued)

FOREIGN PATENT DOCUMENTS

JP        2000-031631 A       1/2000
JP          3173459 B2        6/2001
(Continued)

OTHER PUBLICATIONS

International Search Report dated Feb. 14, 2023 for PCT International Application No. PCT/JP2022/044033.

*Primary Examiner* — Pete T Lee
(74) *Attorney, Agent, or Firm* — Volpe Koenig

(57)          ABSTRACT

A wiring board includes a first insulation layer comprising first and second surfaces; a second insulation layer located at an outermost layer on the first surface; a third insulation layer located at an outermost layer on the second surface; a first mounting region located on an outermost surface on the first surface; a second mounting region located on the outermost surface on the first surface and surrounding the first mounting region; a plane conductor located on the third insulation layer; and a solder resist covering the third insulation layer and the plane conductor and having an opening that exposes part of the plane conductor. In plane perspective, in a frame-shaped region between outer peripheral edges of the first and second mounting regions, the plane conductor comprises clearances at point-symmetric positions taking a center of the opening as a point of symmetry.

11 Claims, 5 Drawing Sheets

(52) U.S. Cl.
CPC ................. *H05K 2201/068* (2013.01); *H05K 2201/09072* (2013.01); *H05K 2201/0929* (2013.01); *H05K 2201/10462* (2013.01); *H05K 2201/10734* (2013.01); *H05K 2201/2018* (2013.01)

(58) Field of Classification Search
CPC . H05K 2201/0929; H05K 2201/10462; H05K 2201/10734; H05K 2201/201
See application file for complete search history.

(56) References Cited

U.S. PATENT DOCUMENTS

| | | | | |
|---|---|---|---|---|
| 2014/0376202 A1* | 12/2014 | Shibutani | ............. | H05K 3/3436 |
| | | | | 361/767 |
| 2015/0000970 A1* | 1/2015 | Iino | ..................... | H05K 1/0271 |
| | | | | 174/262 |

FOREIGN PATENT DOCUMENTS

| | | |
|---|---|---|
| JP | 2021-136351 A | 9/2021 |
| WO | 2023-100894 A1 | 6/2023 |

* cited by examiner

<PLAN VIEW>

<CROSS-SECTIONAL VIEW>

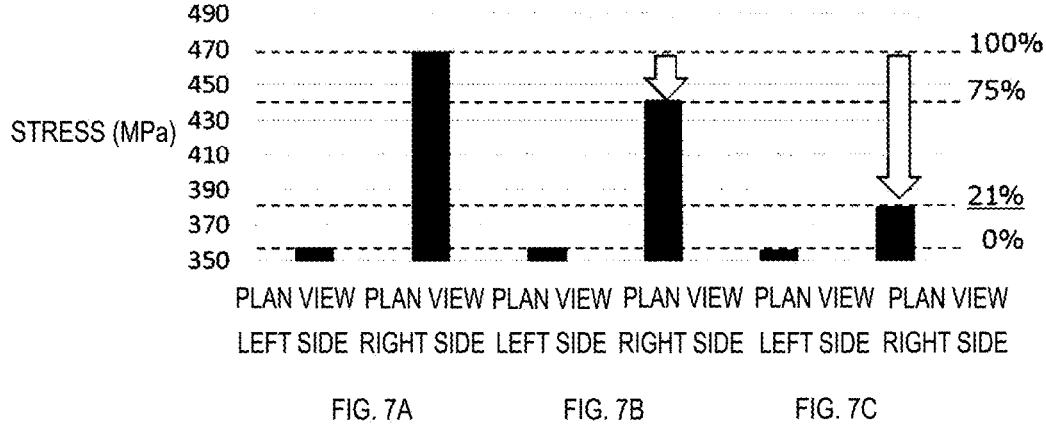
FIG. 7A          FIG. 7B          FIG. 7C
FIG. 8
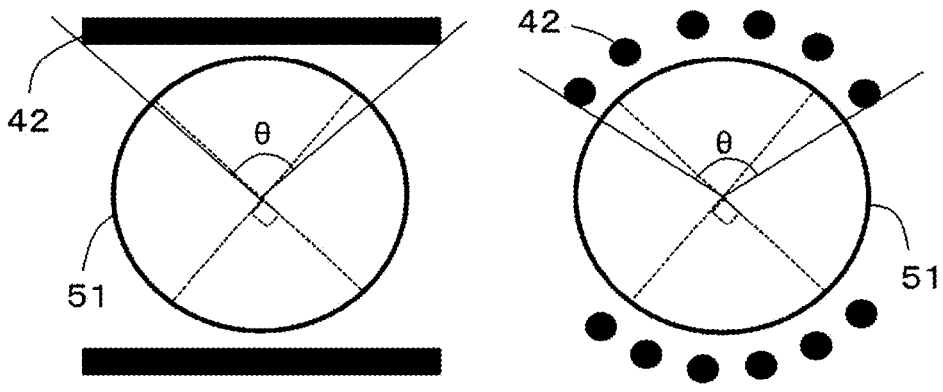
FIG. 9

WIRING BOARD

TECHNICAL FIELD

The present invention relates to a wiring board.

BACKGROUND OF INVENTION

A flip chip ball grid array (FC-BGA) and the like are known as an LSI package in which an LSI chip is mounted on a wiring board. A wiring board used in such an LSI package is provided with a stiffener for reinforcement as described in Patent Document 1, for example.

CITATION LIST

Patent Literature

Patent Document 1: JP 3173459 B

SUMMARY

Solution to Problem

A wiring board according to the present disclosure includes: a first insulation layer including a first surface and a second surface located on an opposite side to the first surface; a second insulation layer located at an outermost layer among insulation layers located on a side of the first surface; a third insulation layer located at an outermost layer among insulation layers located on a side of the second surface; a first mounting region located on an outermost surface on the side of first surface; a second mounting region located on the outermost surface on the side of the first surface and surrounding the first mounting region; a plane conductor located on a surface of the third insulation layer; and a solder resist covering the surface of the third insulation layer and the plane conductor and provided with an opening that exposes part of the plane conductor. In plane perspective, in a frame-shaped region between an outer peripheral edge of the first mounting region and an outer peripheral edge of the second mounting region, the plane conductor includes clearances at point-symmetric positions taking a center of the opening as a point of symmetry.

BRIEF DESCRIPTION OF THE DRAWINGS

FIG. 8 is a graph depicting stress values generated in openings in accordance with the simulation results depicted in FIG. 7.

FIG. 9 is an explanatory diagram describing a variation of a clearance.

DESCRIPTION OF EMBODIMENTS

In a wiring board of related art, a warp is likely to occur in the wiring board due to a difference in thermal expansion coefficients between a substrate, chip, and stiffener. In particular, stress is likely to be concentrated in a region between the chip and the stiffener due to the warp, and cracks are likely to occur in a plane conductor (particularly, the plane conductor around solder) present on a surface (opposite surface) facing the region mentioned above. Because of this, a wiring board in which cracks are unlikely to occur even when the wiring board is repeatedly used in high and low temperature environments is required.

In the wiring board according to the present disclosure, as described above, the plane conductor includes clearances at point-symmetric positions taking the center of the opening as a point of symmetry in the frame-shaped region between the outer peripheral edge of the first mounting region and the outer peripheral edge of the second mounting region in plane perspective. Because of this, cracks are unlikely to occur in the wiring board according to the present disclosure even when the wiring board is repeatedly used in high and low temperature environments.

Figure 1:
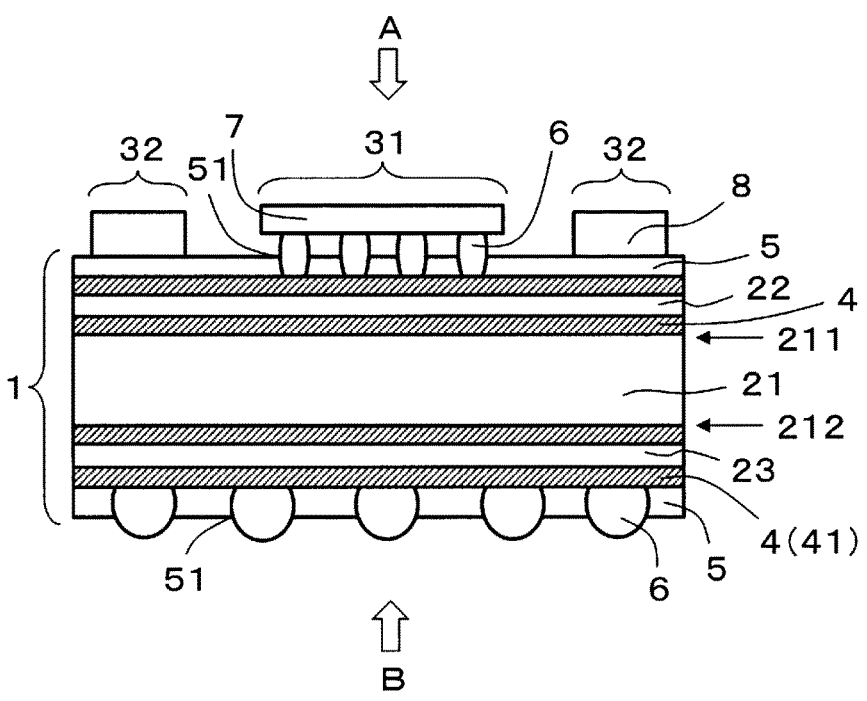
FIG. 1 is an explanatory diagram describing a state in which a chip and a stiffener are mounted on a wiring board according to an embodiment of the present disclosure.

A wiring board according to an embodiment of the present disclosure will be described with reference to FIGS. 1 to 6. FIG. 1 is an explanatory diagram describing a state in which a chip and a stiffener are mounted on a wiring board according to the embodiment of the present disclosure. As illustrated in FIG. 1, a wiring board 1 according to the embodiment includes a first insulation layer 21, a second insulation layer 22, a third insulation layer 23, an electrical conductor layer 4, and a solder resist 5.

The first insulation layer 21 has a first surface 211 and a second surface 212 located on the opposite side to the first surface 211. The first surface 211 and the second surface 212 each correspond to a principal surface of the first insulation layer 21. In the wiring board 1 according to the embodiment, the first insulation layer 21 corresponds to a core insulation layer.

The first insulation layer 21 is not particularly limited as long as it is made of a material having an insulation property. Examples of the material having an insulation property include resins such as an epoxy resin, a bismaleimide-triazine resin, a polyimide resin, and a polyphenylene ether resin. Two or more of these resins may be mixed and used. The thickness of the first insulation layer 21 is not particularly limited and is, for example, 400 μm or more and 1800 μm or less.

The first insulation layer 21 may contain a reinforcing material. Examples of the reinforcing material include insulation fabric materials such as glass fiber, glass non-woven fabric, aramid non-woven fabric, aramid fiber, and polyester fiber. Two or more types of reinforcing materials may be used in combination. An inorganic insulation filler made of, for example, silica, barium sulfate, talc, clay, glass, calcium carbonate, or titanium oxide may be dispersed in the first insulation layer 21.

A through-hole conductor (not illustrated) is usually located in the first insulation layer 21 to electrically connect the upper and lower surfaces of the first insulation layer 21. The through-hole conductor is located inside a through-hole passing through from the first surface 211 to the second surface 212 of the first insulation layer 21. The through-hole conductor is made of, for example, metal plating such as copper plating. The through-hole conductor is connected to the electrical conductor layers 4 formed on both sides of the first insulation layer 21. The through-hole conductor may be formed only on an inner wall surface of the through-hole, or the through-hole may be filled with the through-hole conductor.

The electrical conductor layers 4 and the insulation layers are alternately laminated on the first surface 211 of the first insulation layer 21. In the present specification, the insulation layer located at the outermost layer among the insulation layers located at the first surface 211 side is defined as the second insulation layer 22. When the solder resist 5 is removed, the electrical conductor layer 4 is located on the outermost surface at the first surface 211 side of the wiring board 1. That is, at least two electrical conductor layers 4 and one insulation layer are laminated at the first surface 211 side, and the one insulation layer corresponds to the second insulation layer 22.

The electrical conductor layer 4 is not limited as long as it is made of an electrical conductor such as metal. Specifically, the electrical conductor layer 4 is made of metal foil such as copper foil, metal plating such as copper plating, or the like. The thickness of the electrical conductor layer 4 is not particularly limited, and, for example, is in a range from 10 μm to 30 μm.

Like the first insulation layer 21, the insulation layers including the second insulation layer 22 are not particularly limited as long as they are made of a material having an insulation property. Examples of the material having an insulation property include resins such as an epoxy resin, a bismaleimide-triazine resin, a polyimide resin, and a polyphenylene ether resin. Two or more of these resins may be mixed and used. The insulation layers including the second insulation layer 22 may be made of the same resin or made of different resins. The first insulation layer 21 and the insulation layers including the second insulation layer 22 may be made of the same resin or made of different resins.

An inorganic insulation filler made of, for example, silica, barium sulfate, talc, clay, glass, calcium carbonate, or titanium oxide may be dispersed in the insulation layers including the second insulation layer 22. The thicknesses of the insulation layers including the second insulation layer 22 are not particularly limited, and are, for example, 5 μm or more and 50 μm or less. The insulation layers including the second insulation layer 22 may have the same thickness or may have different thicknesses.

In the insulation layers including the second insulation layer 22, via-hole electrical conductors are formed (not illustrated) to establish electrical connection between the layers. The via-hole electrical conductors are located inside via holes passing through the upper and lower surfaces of the insulation layers including the second insulation layer 22. The via-hole electrical conductor is made of, for example, metal plating such as copper plating. The via-hole electrical conductors are connected to the electrical conductor layers 4 located on both surfaces of the insulation layers including the second insulation layer 22. The via hole may be filled with the via-hole electrical conductor, or the via-hole electrical conductor may be located only on the inner wall surface of the via hole.

As illustrated in FIG. 1, the solder resist 5 may be located on the surface of the second insulation layer 22 and on the surface of the electrical conductor layer 4 laminated at the outermost layer at the first surface 211 side. In FIG. 1, the solder resist 5 is located only on the surface of the electrical conductor layer 4. However, the electrical conductor layer 4 is a wiring pattern, and in a portion where the electrical conductor layer 4 is not present, the solder resist 5 is located on the surface of the second insulation layer 22.

The solder resist 5 is made of resin, and examples of the resin include an acrylic-modified epoxy resin. The solder resist 5 is provided with an opening 51 for electrically connecting the electrical conductor layer 4 and an electrode of a chip 7 via solder 6. The opening 51 is provided in a first mounting region 31, for example.

The first mounting region 31 is a region for mounting the chip 7, and is located on the outermost surface at the first surface 211 side. The first mounting region 31 has a polygonal shape such as a quadrilateral shape in plan view in accordance with the shape of the chip 7. Examples of the chip 7 mounted in the first mounting region 31 include a semiconductor integrated circuit element and an optoelectronic element. The chip 7 is mounted in such a manner that the corner portions of the first mounting region 31 and the corner portions of the chip 7 overlap each other in plane perspective.

Figure 2:
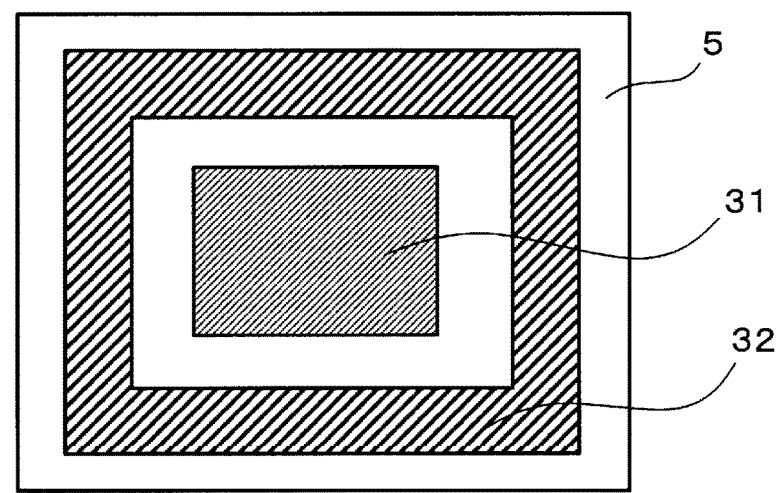
FIG. 2 is an explanatory diagram describing a state in which the wiring board according to the embodiment of the present disclosure is viewed from a direction of an arrow A depicted in FIG. 1.

As illustrated in FIGS. 1 and 2, in the wiring board 1, a second mounting region 32 is located on the outermost surface at the first surface 211 side in such a manner as to surround the first mounting region 31. FIG. 2 is an explanatory diagram describing a state in which the wiring board 1 is viewed from a direction of an arrow A depicted in FIG. 1. The second mounting region 32 is a region where, for example, a stiffener 8 is provided to enhance the rigidity of the wiring board 1.

Like the first surface 211, the electrical conductor layers 4 and the insulation layers are alternately laminated on the second surface 212 of the first insulation layer 21 as well. In the present specification, the insulation layer located at the outermost layer among the insulation layers located at the second surface 212 side is defined as the third insulation layer 23. When the solder resist 5 is removed, the electrical conductor layer 4 is located on the outermost surface at the second surface 212 side of the wiring board 1. That is, at least two electrical conductor layers 4 and one insulation layer are laminated at the second surface 212 side, and the at least one insulation layer corresponds to the third insulation layer 23.

The electrical conductor layer 4 and the insulation layer laminated on the second surface 212 are constituted in the same manner as the electrical conductor layer 4 and the insulation layer laminated on the first surface 211 described above, and therefore detailed description thereof will be omitted here. As illustrated in FIG. 1, the electrical conductor layer 4 laminated at the outermost layer at the second surface 212 side, that is, the electrical conductor layer 4 located on the surface of the third insulation layer 23 is a plane conductor 41.

As illustrated in FIG. 1, the solder resist 5 is located on the surface of the third insulation layer 23 and on the surface of the plane conductor 41. Since the solder resist 5 is constituted as described above, detailed description thereof will be omitted.

In FIG. 1, the solder resist 5 is located only on the surface of the plane conductor 41. However, although the plane conductor 41 is basically a solid layer, a wiring pattern is partly formed therein, and the solder resist 5 is located on the surface of the third insulation layer 23 at a portion where the plane conductor 41 is not present. In the solder resist 5 located on the surface of the third insulation layer 23 and the surface of the plane conductor 41, the opening 51 is provided to electrically connect the plane conductor 41 and an electrode of another wiring board (for example, a mother board) via the solder 6.

Figure 3:
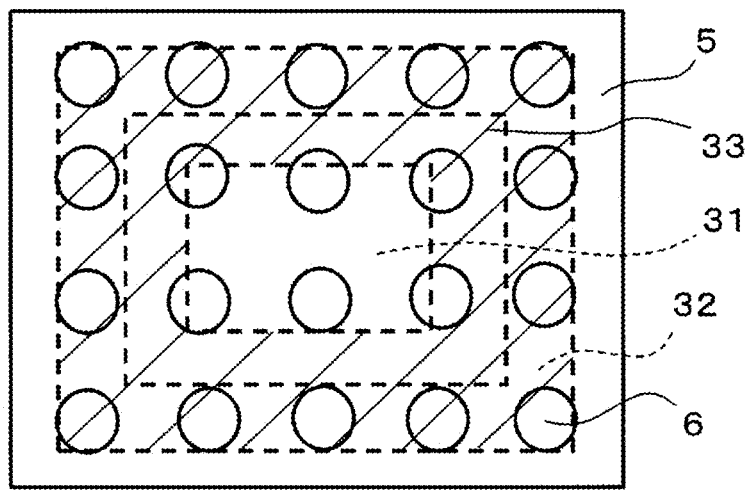
FIG. 3 is an explanatory diagram describing a state in which the wiring board according to the embodiment of the present disclosure is viewed from a direction of an arrow B depicted in FIG. 1.

In the plane conductor 41, a frame-shaped region 33 is located between the outer peripheral edge of the first mounting region 31 and the outer peripheral edge of the second mounting region 32 when the wiring board 1 is viewed in plane perspective. Specifically, the frame-shaped region 33 is a hatched portion indicated in FIG. 3. FIG. 3 is an explanatory diagram for describing a state viewed in a direction of an arrow B depicted in FIG. 1.

Figure 4:
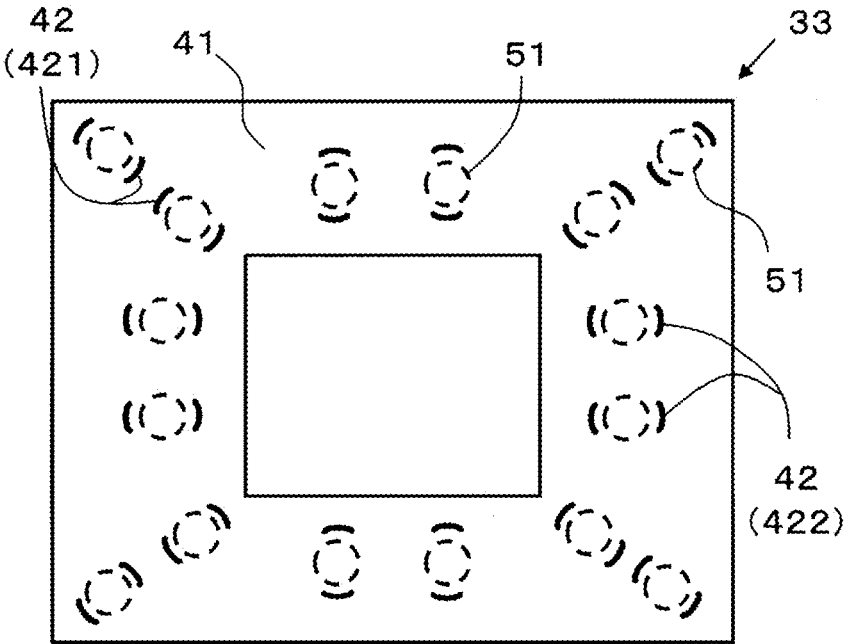
FIG. 4 is an explanatory diagram describing an example of a plane conductor included in the wiring board according to the embodiment of the present disclosure.

As illustrated in FIG. 4, in the plane conductor 41 located in the frame-shaped region 33, clearances (gaps) 42 are located at point-symmetric positions taking the center of the opening 51 of the solder resist as a point of symmetry. FIG. 4 is an explanatory diagram for describing an example of the plane conductor 41. Since the clearances 42 are disposed in this manner, even when a warp is generated due to a difference in thermal expansion coefficients between the wiring board 1, the chip 7, and the stiffener 8, stress concentration in the periphery of the solder 6 connected to the plane conductor 41 is reduced. As a result, cracks are unlikely to occur in the wiring board 1 even when the wiring board 1 is repeatedly used in high and low temperature environments. The expression "point-symmetric positions taking the center of the opening 51 of the solder resist as a point of symmetry" can be defined as, for example, a center point of a line segment bisecting a length L described later, an intersection point of diagonal lines, or a gravity point in each clearance 42.

The shape of the frame-shaped region 33 is determined in accordance with the shapes of the first mounting region 31 and the second mounting region 32. In the wiring board 1, as depicted in FIG. 2, each of the first mounting region 31 and the second mounting region 32 has a quadrilateral shape in plan view. Thus, as depicted in FIG. 3, the frame-shaped region 33 has a quadrilateral frame shape having four corner portions and four side portions.

The clearances 42 includes a first clearance 421 located in a corner portion of the frame-shaped region 33 having a quadrilateral frame shape and a second clearance 422 located in a region other than the corner portions of the frame-shaped region 33. As depicted in FIG. 4, the first clearance 421 is located and aligned along a diagonal line connecting the corner portions of the frame-shaped region 33. As depicted in FIG. 4, the second clearance 422 is located and aligned in a direction perpendicular to the side portion of the frame-shaped region 33 close to the second clearance 422.

In the case where the frame-shaped region 33 has a quadrilateral frame shape, stress is likely to be generated in the corner portion in a direction along a diagonal line connecting the corner portions, and stress is likely to be generated in a direction perpendicular to the side portion of the frame-shaped region 33 in a region other than the corner portions. Accordingly, since the first clearance 421 and the second clearance 422 are located as described above, cracks are more unlikely to be generated even when repeatedly used in high and low temperature environments.

As depicted in FIG. 4, the solder resist 5 includes a plurality of the openings 51. As depicted in FIG. 4, the shape of the opening 51 may be a circular shape or may be a shape other than a circular shape (for example, a polygonal shape such as a triangular shape or a quadrilateral shape) in plane perspective.

All of the plurality of openings 51 may have the same shape, or different shapes may coexist. For example, at least some of the openings 51 may have a circular shape and some of the openings 51 having a shape other than the circular shape may coexist. For example, in the frame-shaped region 33, the opening located in an internal region 331 between the outer peripheral edge of the first mounting region 31 and the inner peripheral edge of the second mounting region 32 may be an elongated opening 52 having at least one of a rectangular shape and an elliptical shape.

In the internal region 331 surrounded by the first mounting region 31 and the second mounting region 32, when an electronic component or the like is mounted in the first mounting region 31, for example, a tensile stress is likely to be generated. By providing the elongated opening 52, the tensile stress may be further reduced. In a region other than the internal region 331, the opening 51 having a circular shape that makes it easy to mount an electronic component or the like may be adopted. With such a configuration, the tensile stress can be reduced while maintaining the mounting efficiency.

Figure 5:
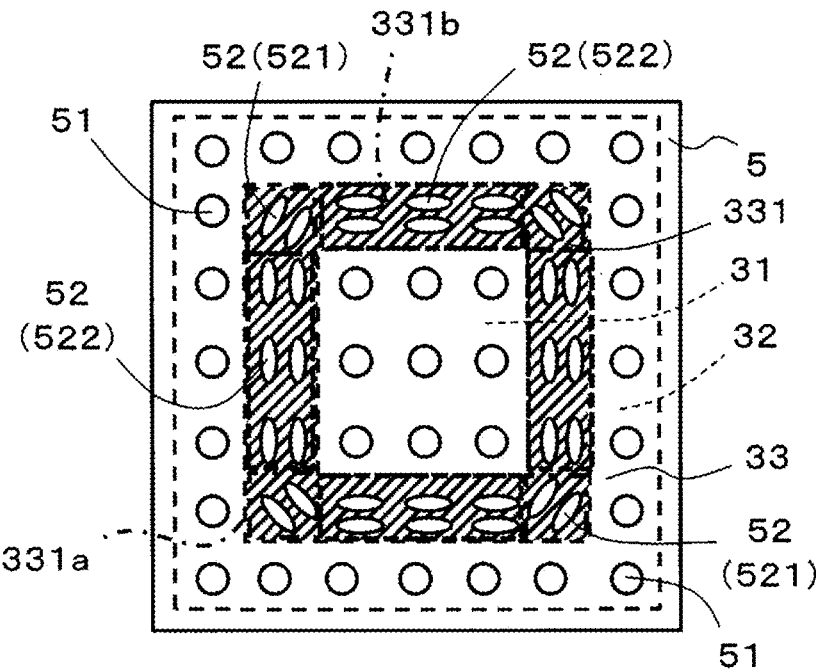
FIG. 5 is an explanatory diagram illustrating a variation of an opening formed in a solder resist.

Specifically, as illustrated in FIG. 5, in the frame-shaped region 33, the elongated opening 52 having an elliptical shape may be located in the internal region 331, and the opening 51 having a circular shape may be located in a region other than the internal region 331. FIG. 5 is an explanatory diagram illustrating a variation of the opening 51 formed in the solder resist 5.

The internal region 331 is a frame-shaped region surrounded by the first mounting region 31 and the second mounting region 32. The shape of the internal region 331 is determined in accordance with the shapes of the first mounting region 31 and the second mounting region 32, and may be, for example, a quadrilateral frame shape having four corner portions 331a and four side portions 331b as depicted in FIG. 5.

When the internal region 331 has a quadrilateral frame shape, the elongated openings 52 include a first elongated opening 521 located in the corner portion 331a of the internal region 331 and a second elongated opening 522 located in the side portion 331b of the internal region 331. The elongated openings 52 may be located regularly, or located irregularly.

For example, the first elongated opening 521 may be located in such a manner that the minor axis direction thereof corresponds to a direction along a diagonal line connecting the corner portions of the internal region 331. The second elongated opening 522 may be located in such a manner that the minor axis direction thereof corresponds to a direction perpendicular to the side portion of the internal region 331 close to the second elongated opening 522. In the case where the internal region 331 has a quadrilateral frame shape, a tensile stress is likely to be generated in the corner portion 331a in the direction along a diagonal line connecting the corner portions 331a, and a tensile stress is likely to be generated in the side portion 331b in the direction perpendicular to the side portion of the internal region 331. Since the first elongated opening 521 and the second elongated opening 522 are located in the manner discussed above, the tensile stress may be further reduced.

The elongated opening 52 is not limited as long as it has a rectangular shape or an elliptical shape. For example, when the elongated opening 52 has a rectangular shape, the elongated opening 52 may have an aspect ratio of 3.15 or more and 5 or less of the long side to 1 of the short side. When the elongated opening 52 has an elliptical shape, the elongated opening 52 may have a flattening ratio of 0.1 or more and 0.5 or less. When the aspect ratio and the flattening ratio have such values, the tensile stress can be further reduced.

The opening area of the opening 51 is not limited, and all the openings may have substantially the same area, or some of the openings may have different areas. The opening area of the elongated opening 52 may be substantially the same as the opening area of the opening 51 other than the elongated opening 52. By making the opening areas substantially the same, the quantity of the solder 6 can be made substantially constant, and the mounting reliability can be further improved.

The expression "substantially the same" includes not only a case of the areas being completely the same, but also a case of the areas being different by about ±5%. Specifically, when an area of one opening (for example, an area of an elongated opening) is assumed to be 1, even in a case where an area of another opening (for example, an area of an opening other than the elongated opening) is 0.95 or more and 1.05 or less, the areas are defined as "substantially the same".

When the opening 51 has a circular shape, the clearance 42 may have, for example, an arc shape along the edge of the opening 51 as illustrated in FIG. 4. Part of the solder resist 5 may be located in the clearance 42. That is, the clearance 42 may be filled with the solder resist 5. Since the clearance 42 is filled with the solder resist 5, swelling or the like starting from the clearance 42 can be reduced.

Figure 6:
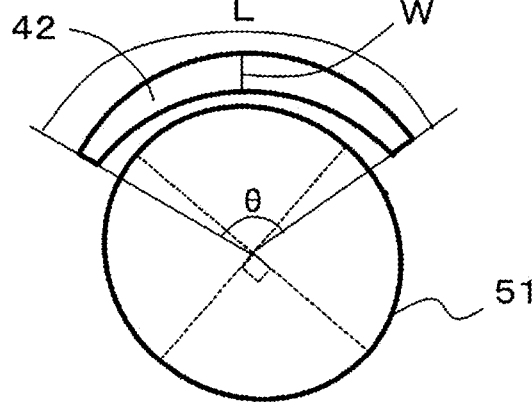
FIG. 6 is an explanatory diagram describing a clearance.

The clearance 42 is described below based on FIG. 6. As illustrated in FIG. 6, the clearance 42 has an arc shape along the edge of the opening 51 having a circular shape. The clearance 42 is located separate from the edge of the opening 51 in plane perspective. The distance between the edge of the opening 51 and the clearance 42 may be, for example, 50 μm or less. As the edge of the opening 51 and the clearance 42 are closer to each other, cracking is more unlikely to occur.

The clearance 42 may have a length of at least 50 μm in a direction orthogonal to the edge of the opening 51. The length in the direction orthogonal to the edge of the opening 51 is indicated as a width W in FIG. 6. The upper limit of the width W is preferably, for example, 100 μm. When the width W falls within such a range, the balance between the stress relaxation effect and the electrical characteristics becomes more favorable. Although FIG. 6 illustrates an example in which the width W of the clearance 42 varies, the width W may have the same size.

The length of the clearance 42 (length L indicated in FIG. 6) is not limited as long as the clearance 42 does not surround the opening 51. This is because, in the plane conductor 41, electrical connection between a portion surrounded by the clearance 42 and a portion other than the surrounded portion is cut when the clearance 42 surrounds the opening 51. The length L may be such that an angle θ formed between imaginary lines respectively connecting the center of the opening 51 and two end portions of the clearance 42 is at least 90°. When the angle θ becomes 180°, the clearance 42 surrounds the opening 51. Accordingly, the upper limit of the angle θ is preferably 135°. When the angle θ has such a size, the balance between the stress relaxation effect and the electrical characteristics becomes more favorable.

The wiring board 1 described above is formed as follows, for example. First, the first insulation layer 21 is prepared. Through-holes are formed in the first insulation layer 21 by drilling, blasting, or laser machining processing. Subsequently, the electrical conductor layers 4 and the insulation layers are alternately laminated at the first surface 211 side and second surface 212 side of the first insulation layer 21. When the electrical conductor layer 4 is formed on the surface of the first insulation layer 21 with copper plating by a semi-additive method, for example, a through-hole conductor may be formed in the through-hole, or the through-hole conductor may be formed in the through-hole in advance. The forming method of the electrical conductor layer 4 and the through-hole conductor are as described above, and detailed description thereof will be omitted.

The insulation layer is formed as follows: a film made of resin such as an epoxy resin, a bismaleimide-triazine resin, a polyimide resin, or a polyphenylene ether resin is attached in vacuo and thermally cured. By performing the laser machining process on the insulation layer, via holes taking the electrical conductor layer 4 as a bottom portion are formed. After the laser machining process, desmear treatment for removing carbide or the like is performed to improve the adhesion strength between the via hole and the via-hole electrical conductor. When the electrical conductor layer 4 is formed on the surface of the insulation layer, the via-hole electrical conductor is formed by plating metal in the via hole.

By repeating the process of forming the electrical conductor layer 4 and the process of forming the insulation layer, a desired number of layers of the electrical conductor layers 4 and the insulation layers can be formed. Of the insulation layers laminated at the first surface 211 side, the insulation layer located at the outermost layer is referred to as the second insulation layer 22. Of the insulation layers laminated at the second surface 212 side, the insulation layer located at the outermost layer is referred to as the third insulation layer 23.

The electrical conductor layer 4 formed on the surface of the third insulation layer 23 is referred to as the plane conductor 41. In the plane conductor 41 located in the frame-shaped region 33, the point-symmetric clearances 42 taking the center of the opening 51 of the covering solder resist 5 as a point of symmetry are formed by, for example, the semi-additive method mentioned above.

Subsequently, the surface of the second insulation layer 22, the surface of the electrical conductor layer 4 laminated at the outermost layer at the first surface 211 side, the surface of the third insulation layer 23, and the surface of the plane conductor 41 are covered with the solder resist 5. In the solder resist 5 covering the first surface 211 side, the opening 51 is formed in a region serving as the first mounting region 31. The clearance 42 may be filled with the solder resist 5.

As described above, the wiring board 1 according to the embodiment is obtained. Since the clearances 42 are disposed in the wiring board 1, even when a warp is generated due to a difference in thermal expansion coefficients between the wiring board 1, the chip 7, and the stiffener 8, stress concentration in the periphery of the solder 6 connected to the plane conductor 41 is reduced. As a result, cracks are unlikely to occur in the wiring board 1 even when the wiring board 1 is repeatedly used in high and low temperature environments.

Figures 7A, 7B, 7C:
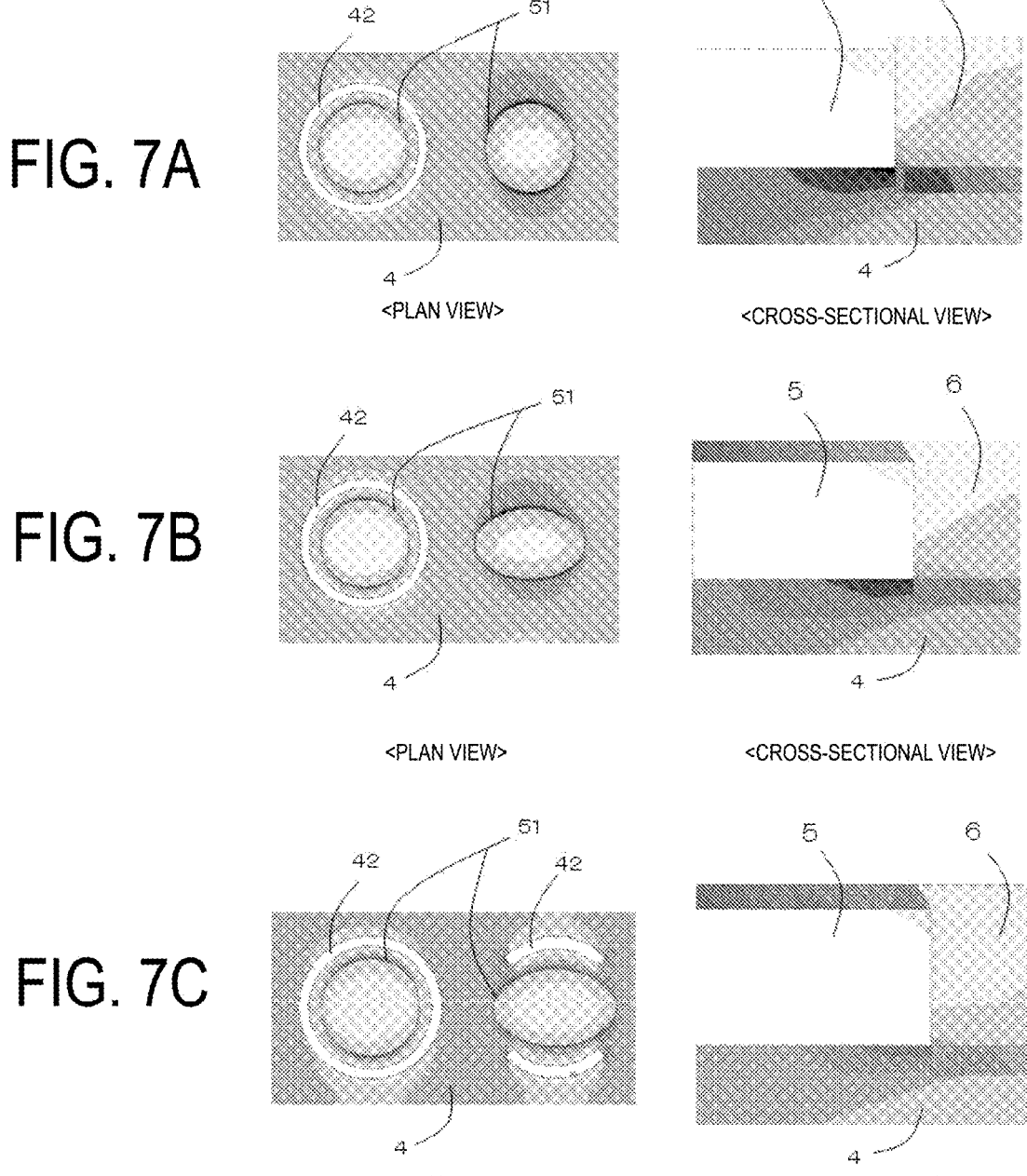
FIGS. 7A-7C are diagrams depicting stress simulation results.

In FIG. 7, stress simulation results (stress distribution diagrams in plan views and cross-sectional views) of the outermost electrical conductor layer of the wiring board according to the present disclosure are depicted. These results were obtained under the conditions depicted in Table 1 given below. The left side of each of FIGS. 7A to 7C is a plan view, and the right side thereof is a cross-sectional view. In the stress distribution diagrams, a darker color indicates a higher stress value. A diagram on the left side in each plan view is a comparative diagram indicating that a

9 | 10 clearance is provided in the electrical conductor in such a manner as to surround the opening of the solder resist and the stress is small (a circular-shaped electrical conductor surrounded by such a clearance is, for example, a signal conductor that needs to be insulated from the surrounding plane-shaped electrical conductor). "ABF-GL102F" described in Table 1 is a thermosetting build-up film manufactured by Ajinomoto Fine-Techno Co., Inc. "SR7300G" described in Table 1 is a photosensitive solder resist manufactured by Resonac Corporation.

of the opening 51 and two end portions of the clearance 42 is at least 90°, as in the case of the arc shape. The upper limit of the angle θ is preferably 135° as described above.

The length of the clearances 42 when the clearances 42 each have a dot shape may take such a length that an angle θ formed between imaginary lines respectively connecting the center of the opening 51 and the dot-shaped clearances 42 at both end portions is at least 90°. The upper limit of the angle θ is preferably 135° as described above.

TABLE 1

| Material | Young's modulus (GPa) | | | | Thermal expansion coefficient (ppm/° C.) | | | | Tg (° C.) | Poisson ratio |
| | T < Tg | | Tg < T | | α1 (T < Tg) | | α2 (Tg < T) | | | |
| | XY | Z | XY | Z | XY | Z | XY | Z | | |
| Electrical conductor | 70 | 70 | — | — | 17 | 17 | — | — | — | 0.3 |
| Build-up resin (ABF-GL102F) | 13 | 13 | 0.4 | 0.4 | 20 | 20 | 49 | 49 | 153 | 0.3 |
| Solder resist (SR7300G) | 2.6 | 2.6 | 0.3 | 0.3 | 38 | 39 | 115 | 115 | 130 | 0.3 |
| Core | 25* | 17* | — | — | 4.6 | 2 | — | — | 260 | 0.3 |
| Chip | 131 | 131 | — | — | 2.6 | 2.6 | — | — | — | 0.3 |
| Stiffener | 118 | 118 | — | — | 17.6 | 17.6 | — | — | — | 0.33 |
| Underfill | 6.5 | 6.5 | 0.35 | 0.35 | 33 | 33 | 115 | 115 | 115 | 0.3 |
| Solder | 34 | 34 | — | — | 22.6 | 22.6 | — | — | — | 0.3 |
| Solder alloy layer | 110 | 110 | — | — | 16 | 16 | — | — | — | 0.35 |
| Stiffener adhesive | 7.2 | 7.2 | — | — | 200 | 200 | — | — | — | 0.45 |
| Sealing resin | 18.5 | 18.5 | — | — | 9.8 | 9.8 | 42 | 42 | 151 | 0.3 |

*Flexural modulus (GPa) is described for the core.

FIG. 8 is a graph depicting the stress values generated in the openings in the stress simulation results of FIGS. 7A to 7C. The opening having a circular shape depicted in FIG. 7A (the circular opening on the right side in the plan view) had a stress value of 468.5 MPa, the opening having an elliptical shape depicted in FIG. 7B (the elongated opening on the right side in the plan view) had a stress value of 441.1 MPa, and the opening having an elliptical shape and provided with clearances on the upper and lower sides of the opening as depicted in FIG. 7C (the elongated opening and the clearances on the right side in the plan view) had a stress value of 380.2 MPa. Thus, it is understood that the opening having the elliptical shape (FIG. 7B) managed to reduce the generation of stress by about 25% compared to the opening having the circular shape (FIG. 7A), and that the opening having the elliptical shape and provided with the clearances around the opening (FIG. 7C) managed to reduce the generation of stress by about 54% compared to the opening only having the elliptical shape (FIG. 7B).

The wiring board of the present disclosure is not limited to the above-described embodiments. In the wiring board 1 according to the embodiment, the clearance 42 has an arc shape along the edge of the opening 51 of the solder resist 5. However, the clearance 42 is not limited to the arc shape. As illustrated in FIG. 9, the clearance 42 may have, for example, a line shape or a dot shape. When the clearance 42 is dot-shaped, the dot-shaped clearances 42 may be formed in an arc shape along the edge of the opening 51 as illustrated in FIG. 9, or the dot-shaped clearances 42 may be formed in a line shape.

The length of the clearance 42 when the clearance 42 has a line shape may take such a length that an angle θ formed between imaginary lines respectively connecting the center In the wiring board 1 according to the embodiment, the first mounting region 31 has a quadrilateral shape in plan view. However, in the wiring board of the present disclosure, the shape of the first mounting region is not limited, and may be a polygonal shape such as a triangular shape, a pentagonal shape or a hexagonal shape, or may be a circular shape or an elliptical shape in plan view.

In the wiring board 1 according to the embodiment, the second mounting region 32 has a quadrilateral frame shape in plan view. However, in the wiring board of the present disclosure, the shape of the second mounting region is not limited, and may be a polygonal frame shape such as a triangular frame shape, a pentagonal frame shape or a hexagonal frame shape, or may be a circularly annular shape or an elliptically annular shape in plan view.

In the wiring board 1 according to the embodiment, the example has been described in which a pair of clearances 42 located at point-symmetric positions taking the center of the opening 51 of the solder resist as a point of symmetry has the same shape and the same size. However, the shapes and the sizes of the paired clearances 42 may differ from each other in accordance with the magnitude of the stress generated around the opening 51. This makes it easy to keep the balance between the dispersion of stress and the electrical characteristics.

REFERENCE SIGNS

1 Wiring board
21 First insulation layer
22 Second insulation layer
23 Third insulation layer
211 First surface 212 Second surface
31 First mounting region
32 Second mounting region
33 Frame-shaped region
331 Internal region
4 Electrical conductor layer
41 Plane conductor
42 Clearance
421 First clearance
422 Second clearance
5 Solder resist
51 Opening
52 Elongated opening
521 First elongated opening
522 Second elongated opening
6 Solder
7 Chip
8 Stiffener

The invention claimed is:

1. A wiring board comprising:
a first insulation layer comprising a first surface and a second surface located on an opposite side to the first surface;
a second insulation layer located at an outermost layer among insulation layers located on a side of the first surface;
a third insulation layer located at an outermost layer among insulation layers located on a side of the second surface;
a first mounting region located on an outermost surface on the side of first surface;
a second mounting region located on the outermost surface on the side of the first surface and surrounding the first mounting region;
a plane conductor located on a surface of the third insulation layer; and
a solder resist covering the surface of the third insulation layer and the plane conductor and provided with an opening that exposes part of the plane conductor,
wherein, in plane perspective, in a frame-shaped region between an outer peripheral edge of the first mounting region and an outer peripheral edge of the second mounting region, the plane conductor comprises clearances at point-symmetric positions taking a center of the opening as a point of symmetry.

2. The wiring board according to claim 1,
wherein the frame-shaped region has a quadrilateral frame shape comprising four corner portions and four side portions in plan view,
the solder resist is provided with a plurality of the openings,
the plane conductor comprises a plurality of the clearances respectively corresponding to the openings,
the plurality of clearances comprise a first clearance located in a corner portion of the corner portions of the quadrilateral frame shape and a second clearance located in a region other than the corner portions of the quadrilateral frame shape,
the first clearance is located and aligned along a diagonal line connecting the corner portions, and the second clearance is located and aligned in a direction perpendicular to a side portion of the side portions close to the second clearance.

3. The wiring board according to claim 1,
wherein in plane perspective, at least part of the plurality of openings has a circular shape, and at the opening having a circular shape, the clearances each have an arc shape along an edge of the opening.

4. The wiring board according to claim 1,
wherein part of the solder resist is located in a clearance of the clearances.

5. The wiring board according to claim 1,
wherein the clearances are separated from an edge of the opening, in plane perspective.

6. The wiring board according to claim 1,
wherein an angle formed between imaginary lines respectively connecting the center of the opening and two end portions of a clearance of the clearances is at least 90° in plane perspective.

7. The wiring board according to claim 1,
wherein the clearances each have a length of at least 50 μm in a direction orthogonal to the edge of the opening.

8. The wiring board according to claim 1,
wherein, in the frame-shaped region, the opening located in an internal region between the outer peripheral edge of the first mounting region and an inner peripheral edge of the second mounting region is an elongated opening having at least one of a rectangular shape and an elliptical shape.

9. The wiring board according to claim 8,
wherein the internal region has a quadrilateral frame shape comprising four corner portions and four side portions,
the elongated opening comprises a first elongated opening located in a corner portion of the corner portions of the internal region and a second elongated opening located in a portion other than the corner portions of the internal region,
a minor axis direction of the first elongated opening corresponds to a direction along a diagonal line connecting the corner portions of the internal region, and
a minor axis direction of the second elongated opening corresponds to a direction perpendicular to a side portion of the side portions of the internal region close to the second elongated opening.

10. The wiring board according to claim 8,
wherein when the elongated opening has a rectangular shape, the elongated opening has an aspect ratio of 3.15 or more and 5 or less of a long side to 1 of a short side, and
when the elongated opening has an elliptical shape, the elongated opening has a flattening ratio of 0.1 or more and 0.5 or less.

11. The wiring board according to claim 8,
wherein an opening area of the elongated opening is substantially equal to an opening area of an opening other than the elongated opening.

* * * * *